(12) United States Patent
Fan et al.

(10) Patent No.: US 8,913,421 B2
(45) Date of Patent: Dec. 16, 2014

(54) WRITING TO A MEMORY CELL

(71) Applicant: Taiwan Semiconductor Manufacturing Company, Ltd., Hsinchu (TW)

(72) Inventors: Allen Fan, Los Altos, CA (US); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/793,404

(22) Filed: Mar. 11, 2013

(65) Prior Publication Data

US 2014/0254247 A1  Sep. 11, 2014

(51) Int. Cl.
*G11C 11/00* (2006.01)
*G11C 11/419* (2006.01)

(52) U.S. Cl.
CPC .................................... *G11C 11/419* (2013.01)
USPC ........................ 365/154; 365/156; 365/189.09

(58) Field of Classification Search
USPC ........... 365/154, 156, 189.09, 189.11, 189.06
See application file for complete search history.

(56) References Cited

U.S. PATENT DOCUMENTS 6,914,797 B2 * 7/2005 Ashizawa et al. ............. 365/145
7,200,030 B2 * 4/2007 Yamaoka et al. ............. 365/154

\* cited by examiner

*Primary Examiner* — David Lam
(74) *Attorney, Agent, or Firm* — Lowe Hauptman & Ham, LLP

(57) ABSTRACT

In a method, various operations are performed based on a voltage line coupled with a plurality of memory cells. Storage nodes of the plurality of memory cells are caused to change to a first logical value. Another first logical value is applied to a plurality of data lines. Each data line of the plurality of data lines carries data for each memory cell of the plurality of memory cells. A control line of the plurality of memory cells is activated. A first voltage value is applied to the voltage line. The first voltage value causes the another first logical value on the plurality of data lines to be transferred to the storage nodes of the plurality of memory cells.

20 Claims, 5 Drawing Sheets

WRITING TO A MEMORY CELL

FIELD

The present disclosure is related to writing to a memory cell.

BACKGROUND

As semiconductor process technology nodes advance to smaller dimensions and lower supply voltages, yields of products depend on a lower limit of a supply voltage value, such as VDDmin. A VDDmin value is designed to work for both writing data to and reading data from a memory cell. As VDDmin value is lowered, a lower yield results, however.

In an existing approach related to static random access memory (SRAM), an NMOS passgate transistor tends to pull data stored in a memory cell towards a reference voltage VSS while a pull-up PMOS transistor in the memory cell tends to pull the same data towards a supply voltage VDD. In order to provide a sufficient margin for writing data to a node of the memory cell, a size of the NMOS passgate transistor is designed to be about two to three times a size of the PMOS pull-up transistor. An increase in a size of the NMOS passgate transistor results in a bigger size of the memory cell and additional leakage current.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
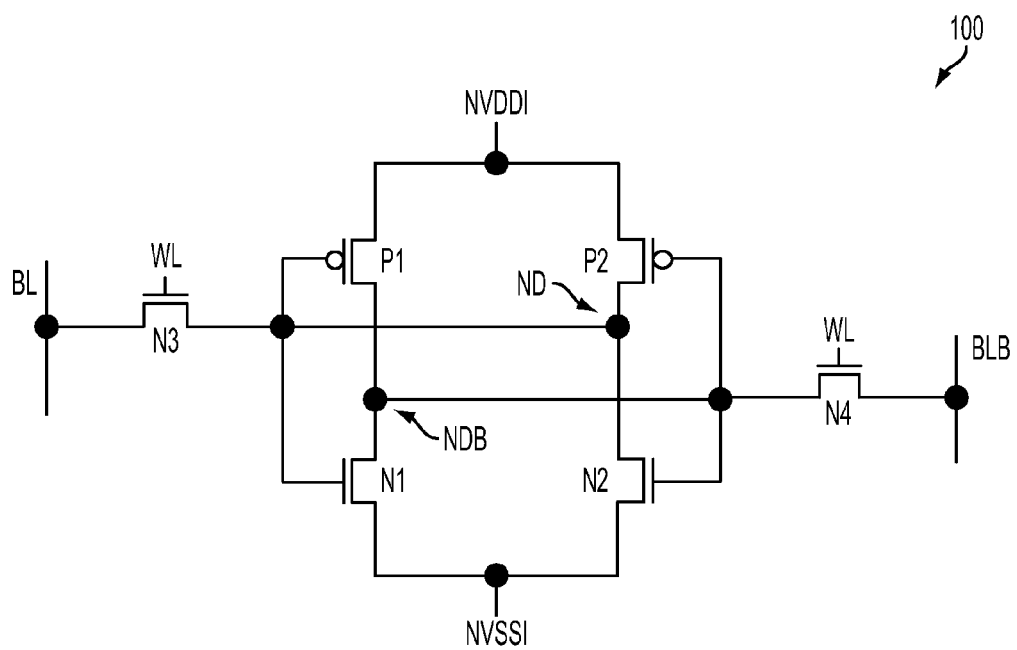
FIG. 1 is a diagram of a memory cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Margins for writing data to a memory cell, die areas and a leakage current from the memory cell are better compared with other approaches.

Memory Cell

FIG. 1 is a diagram of a memory cell 100, in accordance with some embodiments.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a cross-coupled pair of inverters. For example, transistor P1 and transistor N1 form a first inverter while transistor P2 and transistor N2 form a second inverter. PMOS transistors P1 and P2 are called pull-up transistors. NMOS transistors N1 and N2 are called pull-down transistors. NMOS transistors N3 and N4 are called passgate transistors.

Sources of transistors P1 and P2 are coupled together and serve as a supply voltage node NVDDI having a supply voltage VDD (not labeled). A voltage value of supply voltage VDD varies depending on a technology node. In some embodiments, voltage VDD is about 1.0 V. A drain of transistor P1 is coupled with a drain of transistor N1, a storage node NDB, a gate of transistor P2, a gate of transistor N2, and a source of transistor N4. A drain of transistor P2 is coupled with a drain of transistor N2, a storage node ND, a gate of transistor P1, a gate of transistor N1, and a source of transistor N3. Sources of transistors N1 and N2 are coupled together and serve as a supply reference voltage node NVSSI having a supply reference voltage VSS (not labeled), which, in some embodiments, is ground or 0 V.

A word line WL is coupled with a gate of each of transistors N3 and N4. In a row having a plurality of memory cells 100, word line WL is coupled with a gate of each of transistors N3 and N4 of a plurality of memory cells 100 in the row. Word line WL is also called a write control line because a signal on word line WL controls transistors N3 and N4 for data on bit lines BL and BLB to be written to corresponding nodes ND and NDB.

A drain of transistor N3 is coupled with a bit line BL. A drain of transistor N4 is coupled with a bit line BLB. In a column having a plurality of memory cells 100, bit lines BL and BLB are coupled with each drain of corresponding transistors N3 and N4 of the plurality of memory cells 100 in the column.

Bit lines BL and BLB serve as both data inputs and outputs for memory cell 100. Each of bit lines BL and BLB is also called a data line because the data carried on bit lines BL and BLB are written to and read from corresponding nodes ND and NDB.

Writing Data

In some embodiments, in a write operation of memory cell 100, applying a logical value to a first bit line and the opposite logical value to the other bit line enables writing the logical values at the bit lines to nodes ND and NDB of memory cell 100. Word line WL is then activated to turn on transistors N3 and N4. As a result, node ND is electrically coupled with bit line BL, and node NDB is electrically coupled with bit line BLB. The data on bit lines BL and BLB is therefore transferred to nodes ND and NDB, respectively. Explained in another way, when word line WL is activated, the data on bit lines BL and BLB is transferred to nodes ND and NDB, respectively.

For illustration, node ND stores a low logical value, and is to be written with a low logical value. In other words, node ND is written with a low logical value that overwrites an existing low logical value. Because node ND stores a low logical value, by operations of memory cell 100, node NDB stores a high logical value. As a result, PMOS transistor P1 is on, NMOS transistor N1 is off, PMOS transistor P2 is off, and NMOS transistor N2 is on. In some embodiments, a low logical value is applied to bit line BL, and transistor N3 is turned on to transfer the low logical value on bit line BL to node ND. Because PMOS transistor P2 is off, no contention exists between NMOS transistor N3 and PMOS transistor P2 such as in a situation explained below when node ND stores a high logical value and a low logical value is written to node ND.

For illustration, node ND stores a high logical value, and is written with a low logical value. In other words, node ND is written with a low logical that overwrites an existing high logical value. Because node ND stores a high logical value, by operations of memory cell 100, node NDB stores a low logical value. As a result, PMOS transistor P1 is off, NMOS transistor N1 is on, PMOS transistor P2 is on, and NMOS transistor N2 is off. In some embodiments, a low logical value is applied to bit line BL. Word line WL is activated to turn on transistor N3. Because NMOS transistor N3 is on, NMOS transistor N3 tends to pull node ND towards a low logical value on bit line BL. Because PMOS transistor P2 is on, PMOS transistor P2 tends to pull node ND towards supply voltage VDD at the source of PMOS transistor P2 or node NVDDI. In other words, a contention exists between NMOS transistor N3 and PMOS transistor P2. Because of the contention, writing a low logical value to node ND to overwrite an existing high logical value is more difficult than writing a low logical value to overwrite an existing low logical value. Further, when the contention exists, writing to a node, such as node ND, takes a longer time than writing to the same node without the contention.

In various embodiments of the present disclosure, node ND is forced to have a low logical value before a low logical value on bit line BL is written to node ND, regardless of the logical value stored in node ND before writing. For example, in some embodiments, when node ND is to be written with a low logical value, node NVDDI is applied with a first value of supply voltage VDD sufficient to change the data in node ND so that node ND is considered to store a low logical value. For illustration, node ND originally stores a high logical value, and the first supply voltage VDD value is 0 V. When 0 V is applied to node NVDDI, memory cell 100 including transistor P2 is turned off. The data stored in node ND is therefore changed to a low logical value. A voltage VDD value of 0 V is used for illustration. Other values sufficiently to turn off PMOS transistor P2 and to cause node ND to have a low logical value are within the scope of various embodiments. In some embodiments, for a 1.0 V VDD for PMOS transistor P2 to operate, a voltage VDD value of about 0.7 V or below is sufficient to cause node ND to have a low logical value. In some embodiments, for node ND to have a low logical value, a voltage VDD value is selected based on a threshold voltage of transistor P2, a threshold voltage of transistor N2, a threshold voltage of transistor P1, and/or a threshold voltage of transistor N1. In some embodiments, a voltage VDD value is selected to be less than a maximum value of the threshold voltage of transistor P2, the threshold voltage of transistor N2, the threshold voltage of transistor P1, and the threshold voltage of transistor N1. In some embodiments, a voltage VDD value is selected to be less than a maximum value of the threshold voltage of transistor P2 and the threshold voltage of transistor N2.

After the data in node ND changes to a low logical value, a low logical value is then applied to bit line BL, and a high logical value is applied to bit line BLB. Word line WL is then activated with a high logical value. As a result, the low logical value on bit line BL and the high logical value on bit lint BLB are ready to be transferred to node ND and node NDB when memory cell 100 is turned on.

A second value of supply voltage VDD sufficiently to turn on memory cell 100 and to write a low logical value to node ND and a high logical value node NDB is applied to node NVDDI. For example, in some embodiments, node NVDDI is applied with 1.0 V to transfer the low logical value on bit line BL to node ND and the high logical value on bit line BLB to node NDB. Effectively, node ND is written with a low logical value that overwrites the low logical value currently stored in node ND. Consequently, writing is faster, and embodiments of the present disclosure are advantageous over other approaches. For example, in other approaches, node ND originally stores a high logical value, and the data in node ND is not changed to a low logical value before being written with a low logical value. As a result, in the other approaches, node ND is written with a low logical value over a high logical value stored in node ND. In such a situation, a contention exists between NMOS transistor N3 and PMOS transistor P2 in the other approaches.

In various embodiments of the present disclosure, because no contention exists between NMOS transistor N3 and PMOS transistor P2 when writing is performed, writing is easier and faster. Further, in some embodiments, also because there is no contention, transistors N3 and P2 are designed to have substantially the same current driving strength or driving capability. In some embodiments, a size of transistor N3 is selected to be substantially the same as a size of transistor P2. Various embodiments of the present disclosure are therefore further advantageous over other approaches in which a contention exists when writing occurs. For example, to ensure proper writing, a size of NMOS transistor N3 of the other approaches is larger than a size of PMOS transistor P2, such as two to three times larger. In some embodiments, a size of transistor N3 of the present disclosure is reduced by about 50% to 66% compared with a corresponding transistor N3 in other approaches.

In various embodiments, so that memory cell 100 is as small as possible, each of transistor P2 and transistor N3 is designed to have a size as small as acceptable by a corresponding manufacturing process. Embodiments of the disclosure are further advantageous over other approaches. For example, in the other approaches, because of the contention between transistor N3 and transistor P2, a size of transistor N3 is selected to be about 2 to 3 times larger than a size of transistor P2. In other words, the size of transistor N3 depends on the size of transistor P2. As a result, in the other approaches, if transistor P2 is selected to be a minimum size allowable by the manufacturing process, the size of transistor N3 is about 2 to 3 times larger than a minimum size allowable by a corresponding manufacturing process.

In various embodiments, to read data in node ND reliably, a size of NMOS transistor N2 is designed to be about 1.5 times a size of NMOS transistor N3. In other words, a size of transistor NMOS N2 depends on a size of NMOS transistor N3. In various embodiments, a size of NMOS transistor N3 is reduced compared with a size of transistor N3 in other approaches. As a result, a size of NMOS transistor N2 is also reduced compared with a size of NMOS transistor N2 in other approaches. In some embodiments, because a size of NMOS transistor N3 is reduced by about 50% to 66%, a size of NMOS transistor N2 is also reduced by about 50% to 66%.

In various embodiments, memory cell 100 includes a plurality of transistors N3 coupled with node ND of memory cell 100. For example, each source of a transistor N3 of the plurality of transistors N3 is coupled with node ND. Further, each drain of transistor N3 of the plurality of transistors N3 is coupled with a corresponding bit line BL. Each of a transistor N3 and a corresponding bit line BL serve as a separate read-write port for node ND. Additionally, in various embodiments, a memory macro includes two memory arrays, and each memory array includes thousands of memory cells 100. Consequently, a reduction in sizes of transistors N3 and N2 in thousands of memory cells 100 results in a large reduction in size for the two memory arrays and for the memory macro.

In some embodiments, a leakage current depends on a size of transistors N3 and N2. Because a size of each of transistors N3 and N2 is reduced compared with a leakage current in other approaches, the leakage current in various embodiments of the present disclosure is also reduced. In the embodiments that a memory macro includes two memory arrays, and each memory array includes thousands of memory cells 100, a reduction in leakage currents through transistors N3 and N2 of thousands of memory cells 100 results in a large reduction in leakage currents for the two memory arrays and for the memory macro.

In some embodiments, because there is no contention between transistors N3 and P2, memory cell 100 operates at a minimum voltage value VDD, such as VDDmin, that is lower than a minimum voltage value VDDmin of a memory cell in which there is a contention between transistors N3 and P2.

Row of Memory Cells

Figure 2:
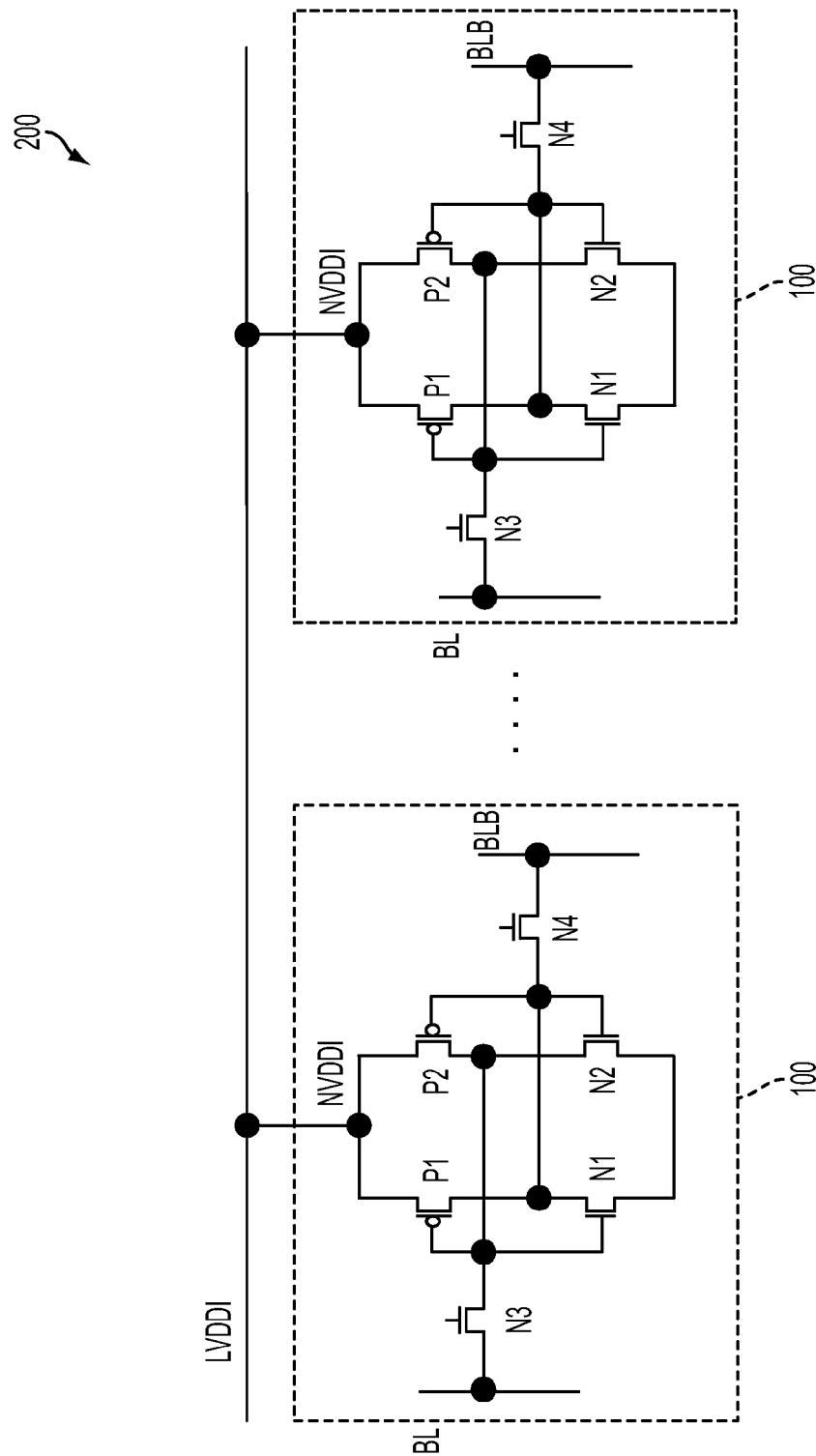
FIG. 2 is a diagram of a row of memory cells, in accordance with some embodiments.

FIG. 2 is a diagram of a row 200 of a plurality of memory cells 100, in accordance with some embodiments. For simplicity, various details of memory cells 100 are not labeled.

A supply voltage line LVDDI is coupled with nodes NVDDI of memory cells 100 in row 200. In some embodiments, a supply voltage VDD is provided to supply voltage line LVDDI and nodes NVDDI of memory cells 100 to turn on and off memory cells 100 at the same time.

In various embodiments, all memory cells 100 in row 200 are written at the same time. Similar to the situation in which one memory cell 100 is written, line LVDDI and nodes NVDDI of corresponding memory cells 100 are applied with a first voltage VDD value sufficient to cause nodes ND of memory cells to have a low logical value. For example, a voltage value of 0 V is applied to line LVDDI and nodes NVDDI. Memory cells 100 including transistors P2 are therefore turned off. As a result, nodes ND of memory cells 100 have a low logical value. A low logical value is applied to bit lines BL of corresponding memory cells 100. Word line WL is activated. A second voltage value, such as 1.0 V, for example, is applied to line LVDDI and to nodes NVDDI of memory cells 100. Consequently, nodes ND of all memory cells 100 of row 200 are written with a low logical value.

In the present disclosure, converting the data in nodes ND of all memory cells 100 to a low logical value and then writing a low logical value to nodes ND is advantageously different from writing in other approaches. For example, in other approaches, not all memory cells in a row are written at the same time. At least one memory cell in the row is not written while the rest of the memory cells in the same row are being written, for example. For illustration, in other approaches, a row includes N memory cells. One memory cell of the row is written with a low logical value while N−1 memory cells in the same row are not to be written. In other words, the N−1 memory cells in the row are to retain data currently stored in the N−1 memory cells. As a result, nodes NVDDI in the other approaches are to remain at a voltage level sufficient for PMOS transistors P2 of the plurality of memory cells 100 to be on. In such a condition, the data currently stored in nodes ND of the plurality of memory cells 100 continue to have the data currently stored thereon. In other words, line LVDDI and nodes NVDDI in the other approaches are not applied with a first VDD voltage value, such as 0 V, as in various embodiments of the present disclosure. In other approaches, if a VDD value of 0 V is applied to line LVDDI and nodes NVDDI, data in all memory cells in the row, including the data in the N−1 memory cells that are supposed to retain the data, are destroyed.

Method

Figure 3:
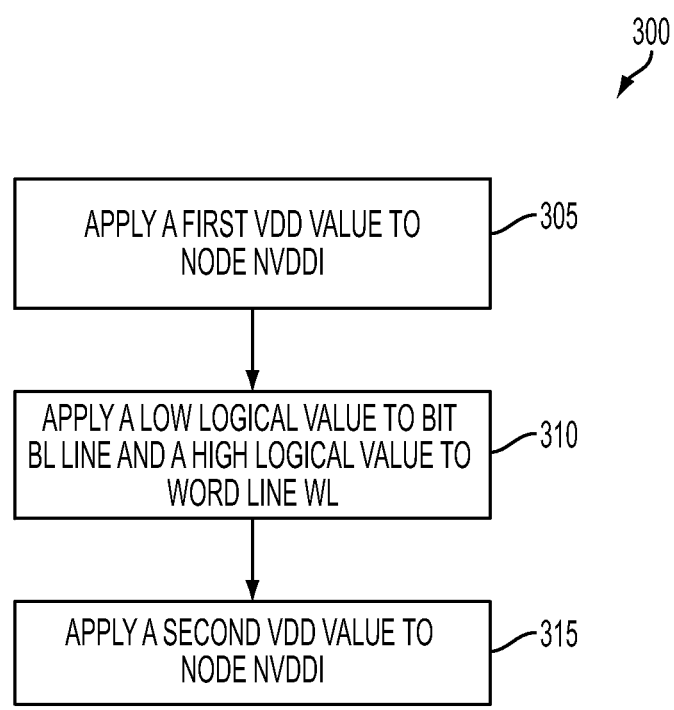
FIG. 3 is a flowchart of a method of writing data to a node of the memory cell in FIG. 1, in accordance with some embodiments.

FIG. 3 is a flowchart of a method 300 for writing a low logical value to node ND of memory 100 in FIG. 1, in accordance with some embodiments. In this illustration, a size of NMOS transistor N3 is substantially the same as a size of PMOS transistor P2. Further, a size of NMOS transistor N2 is about 1.5 times a size of NMOS transistor N3. For illustration, node ND stores either a low or a high logical value.

In operation 305, a first voltage VDD value, such as 0 V, is applied to node NVDDI. As a result, memory cell 100 is turned off. Further, node ND has a low logical value, regardless of the logical value stored in node ND before the first voltage value of 0 V is applied to node NVDDI.

In operation 310, a low logical value is applied to bit line BL and a high logical value is applied to word line WL.

In operation 315, a second voltage value VDD, such a 1.0 V, is applied to node NVDDI. As a result, memory cell 100 including transistor N3 is turned on, and the low logical value on bit line BL is transferred through transistor N3 to node ND. Effectively, node ND is written with a low logical value that overwrites the logical value initially stored in node ND, regardless of whether the original logical value is a high or a low logical value. In various embodiments, because operation 315 is performed after operations 310, once bit line BL and word line WL received the corresponding low and high logical values, node ND continues to stay at a low logical value until memory cell 100 is turned on when node NVDDI is applied with 1.0 V. As a result, the low logical value on bit line BL is written over the low logical value then stored in node ND.

In the above illustration of FIG. 3 in which node ND is written with a low logical value over a low logical value, a total writing time in a write operation of the present disclosure is faster than the situation in which the original high logical value is not converted to a low logical value before transferring the low logical value on bit line BL to node ND. Further, writing a low logical value to node ND is for illustration. Writing a high logical value to node ND is the same as writing a low logical value to node NDB. Writing a low logical value to node NDB with references to bit line BLB, transistors N4, P1, and N1 is similar to writing a low logical value to node ND with references to bit line BL, transistors N3, P2, and N2 as illustrated above.

In FIG. 3, writing to node ND of a memory cell 100 is for illustration. Writing to nodes ND of a plurality of memory cells 100 in a row, such as row 200, at the same time, is similar.

In the above descriptions in this document, references to node ND and associated circuit elements, such as bit line BL, and transistors N3, P2, and N2 are used for illustration. The invention concepts are applicable to node NDB and associated circuit elements, such as bit line BLB, transistors N4, P1, and N1.

Another Memory Cell

Figure 4:
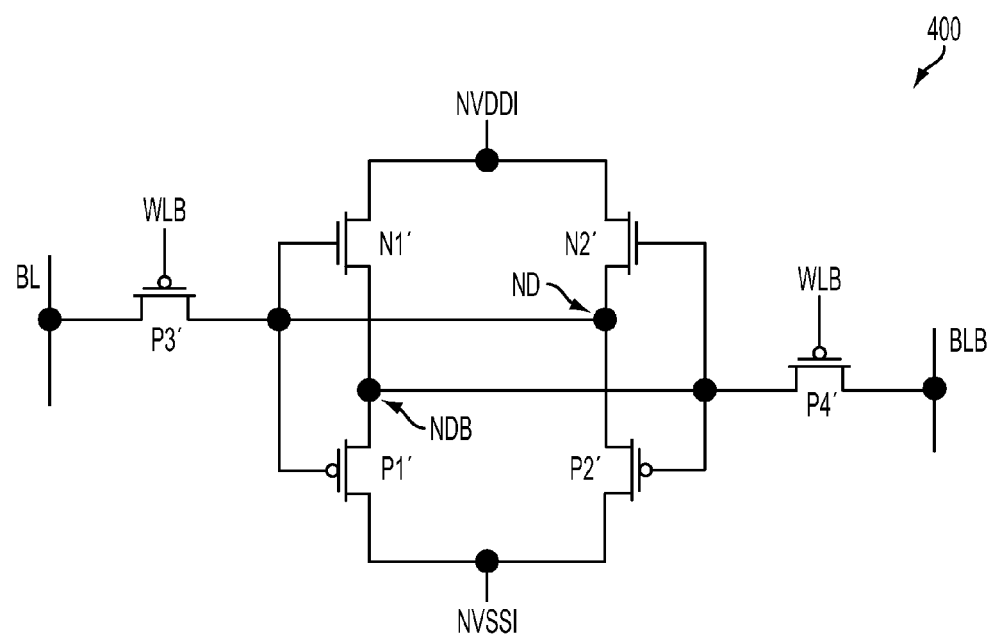
FIG. 4 is a diagram of a memory cell, in accordance with some embodiments.

FIG. 4 is a diagram of a memory cell 400, in accordance with some embodiments. Compared with memory cell 100 in FIG. 1, NMOS transistors N1' and N2' correspond to PMOS transistors P1 and P2 in FIG. 1, respectively. PMOS transistors P1', P2', P3', and P4' correspond to NMOS transistors N1, N2, N3, and N4, respectively. A word line WLB corresponds to word line WL. Effectively, PMOS transistors in memory cell 400 replace NMOS transistors in memory cell 100, and NMOS transistors in memory cell 400 replace PMOS transistors in memory cell 100. Further, word line WLB is activated with a low logical value while word line WL in memory cell 100 is activated with a high logical value.

Operations of memory cell 400 are similar to operations of memory cell 100, considering differences in configurations of memory cell 400 and memory cell 100.

Another Method

Figure 5:
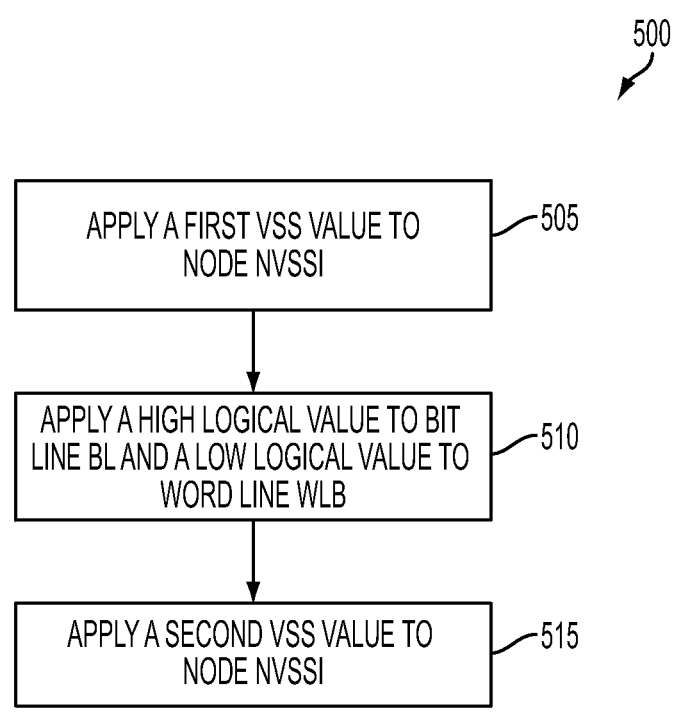
FIG. 5 is a flowchart of a method of writing data to a node of the memory cell in FIG. 4, in accordance with some embodiments.

FIG. 5 is a flowchart of a method 500 for writing a high logical value to node ND of memory cell 400 in FIG. 4, in accordance with some embodiments. For illustration, node ND of memory cell 400 initially stores a low logical value.

In operation 505, a first reference voltage VSS value, such as 1 V, is applied to node NVSSI. As a result, memory cell 400 is turned off. Further, node ND has a high logical value of node NVSSI through transistor P2', regardless of the logical value stored in node ND before the first reference voltage VSS value is applied to node NVSSI.

In operation 510, a high logical value is applied to bit line BL and a low logical value is applied to word line WLB.

In operation 515, a second reference voltage value VSS, such a 0 V is applied to node NVSSI. As a result, memory cell 400 including transistor P3' is turned on, and the high logical value on bit line BL is transferred through transistor P3' to node ND. Effectively, node ND is written with a high logical value that overwrites the logical value initially stored in node ND, regardless of whether the original logical value is a high logical value or a low logical value. In various embodiments, operation 515 is performed after operations 510 so that once bit line BL and WL received the corresponding low and high logical values, node ND continues to stay at a high logical value until memory cell 400 is turned on. Node NVSSI is then applied with 0 V to turn on memory cell 400 for the high logical value on bit line BL to write over the high logical value then stored on node ND.

In the above illustration of FIG. 5, when writing node ND with a high logical value over a high logical value that was converted from a low logical value, a total writing time in a write operation of the present disclosure is faster than the situation in which the original low logical value is not converted to a high logical value before transferring the high logical value on bit line BL to node ND. Further, writing a high logical value to node ND is for illustration, writing a low logical value to node ND is the same as writing a high logical value to node NDB. Writing a high logical value to node NDB with reference to bit line BLB, transistors P4', N1', and P1' is similar to writing a high logical value to node ND with reference to bit line BL, transistors P3', N2', and P2'.

In FIG. 5, writing to node ND of a memory cell 400 is for illustration. Writing to nodes ND of a plurality of memory cells 400 in a row at the same time is similar.

In the descriptions in this document, references to node ND and associated circuit elements are used for illustration. The inventive concepts are applicable to node NDB and associated circuit elements. For example, with reference to memory 100, references to node ND, bit line BL, transistors N3, P2, and N2 are for illustration. The inventive concepts are applicable to node NDB, bit line BLB, and transistors N4, P1, and N1 are similar, and are within the contemplated scope of the present disclosure. Similarly, with references to memory 400, references to node ND, bit line BL, transistors P3', N2', and P2' are for illustration. The inventive concepts are applicable to node NDB, bit line BLB, transistors P4', N1', and P1' are similar, and are within the scope of various embodiments.

In some embodiments regarding a method, various operations are performed based on a voltage line coupled with a plurality of memory cells. Storage nodes of the plurality of memory cells are caused to change to a first logical value. Another first logical value is applied to a plurality of first data lines. Each first data line of the plurality of first data lines carries data for each memory cell of the plurality of memory cells. A control line of the plurality of memory cells is activated. A first voltage value is applied to the voltage line. The first voltage value causes the another first logical value on the plurality of first data lines to be transferred to the storage nodes of the plurality of memory cells.

In some embodiments, a memory cell comprises a first transistor of a first type, a second transistor of the first type, a first transistor of a second type different from the first type, a second transistor of the second type, a third transistor of the second type, and a fourth transistor of the second type. The first transistor of the first type, the second transistor of the first type, the first transistor of the second type, and the second transistor of the second type are configured as a cross-coupled pair of inverters. The third transistor of the second type is configured as a first passgate transistor. The fourth transistor of the second type is configured as a second passgate. A first terminal of the third transistor of the second type is configured as a first node, and is coupled with a first terminal of the second transistor of the first type. The memory cell is configured such that a driving capability of the third transistor of the second type is substantially the same as a driving capability of the second transistor of the first type.

In some embodiments regarding a method, various operations are performed based on a memory cell having a passgate transistor of a first type and a first transistor of a second type, wherein a first terminal of the passgate transistor is coupled with a first terminal of the first transistor, and serves as a first storage node of the memory cell, and wherein a size of the passgate transistor is substantially equal to a size of the first transistor. A first voltage value is applied to a second terminal of the first transistor to cause the first storage node to have a first logical value. Another first logical value is applied to a second terminal of the passgate transistor. A data line coupled with a second terminal of the passgate transistor is activated. A second voltage value is applied to the second terminal of the first transistor to cause the first storage node to have the another first logical value from the second terminal of the passgate transistor. The second voltage value is different from the first voltage value.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor is configured as a drain, and a drain is configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
based on a voltage line coupled with a plurality of memory cells,
causing storage nodes of the plurality of memory cells to have a predetermined logical value by turning off the plurality of memory cells;
applying a set of logical values to a plurality of data lines, wherein each data line of the plurality of data lines carries data for each memory cell of the plurality of memory cells;
activating a control line of the plurality of memory cells, wherein the control line is coupled with the plurality of memory cells; and
applying a first voltage value to the voltage line sufficient to turn on the plurality of memory cells, wherein the first voltage value causes the set of logical values on the plurality of data lines to be transferred to the corresponding storage nodes of the plurality of memory cells.

2. The method of claim 1, wherein
causing the storage nodes of the plurality of memory cells to change to the predetermined logical value comprises applying a second voltage value to the voltage line sufficient to turn off the plurality of memory cells; and
the second voltage value is different from the first voltage value.

3. The method of claim 2, wherein
a memory cell of the plurality of memory cells includes a first transistor of a first type coupled with a second transistor of a second type at a storage node of the memory cell;
the first type is different from the second type; and
the second voltage value is selected based on a threshold of the second transistor.

4. The method of claim 3, wherein
the first type is a P-type and the second type is an N-type; and
the predetermined logical value is a low logical value.

5. The method of claim 3, wherein
the first type is an N-type and the second type is a P-type; and
the predetermined logical value is a high logical value.

6. The method of claim 1, wherein
each data line is coupled with a first terminal of a first transistor;
the control line is coupled with a second terminal of the first transistor;
a node of the storage nodes is coupled with a third terminal of the first transistor and with a first terminal of a second transistor;
a second terminal of the second transistor is coupled with the voltage line;
the first transistor is of a first type; and
the second transistor is of a second type different from the first type.

7. The method of claim 6, wherein
a driving capability of the first transistor is configured to be equal to a driving capability of the second transistor.

8. The method of claim 6, wherein
a size of the first transistor is configured to be equal to a size of the second transistor.

9. A memory cell comprising:
a first transistor of a first type;
a second transistor of the first type;
a first transistor of a second type different from the first type;
a second transistor of the second type;
a third transistor of the second type; and
a fourth transistor of the second type,
wherein
the first transistor of the first type, the second transistor of the first type, the first transistor of the second type, and the second transistor of the second type are configured as a cross-coupled pair of inverters;
the third transistor of the second type is configured as a first passgate transistor;
the fourth transistor of the second type is configured as a second passgate transistor;
a first terminal of the third transistor of the second type is configured as a first node, and is coupled with a first terminal of the second transistor of the first type; and
the memory cell is configured such that a driving capability of the third transistor of the second type is configured to be the same as a driving capability of the second transistor of the first type.

10. The memory cell of claim 9, wherein
a size of the third transistor of the second type is configured to be the same as a size of the second transistor of the first type.

11. The memory cell of claim 9, wherein
the first type is a P-type, the second type is an N-type.

12. The memory cell of claim 9, wherein
the first type is an N-type, the second type is a P-type.

13. The memory cell of claim 9, wherein
in a write operation of the memory cell, a second terminal of the second transistor is configured to receive a voltage based on a threshold voltage of the second transistor.

14. A method comprising:
based on a memory cell having a passgate transistor of a first type and a first transistor of a second type, wherein a first terminal of the passgate transistor is coupled with a first terminal of the first transistor, and serves as a first storage node of the memory cell, and wherein a size of the passgate transistor is configured to be equal to a size of the first transistor, performing the following operations
applying a first voltage value to a second terminal of the first transistor to turn off the memory cell such that the first storage node has a predetermined logical value;
applying a to-be-written logical value to a second terminal of the passgate transistor;
activating a control line coupled with a second terminal of the passgate transistor; and
applying a second voltage value to the second terminal of the first transistor to turn on the memory cell such that the first storage node has the to-be-written logical value from the second terminal of the passgate transistor, wherein the second voltage value is different from the first voltage value.

15. The method of claim 14, wherein
the memory cell further includes a second transistor of the second type, a first transistor of the first type, a second transistor of the first type, and a second passgate transistor of the first type;
the first transistor of the second type and the first of the first type form a first inverter;
an input of the first inverter is coupled with the first passgate transistor and is configured as the first storage node;

the second transistor of the second type and the second transistor of the first type form a second inverter; and an input of the second inverter is coupled with the second passgate transistor and is configured as a second storage node for the memory cell.

16. The method of claim 14, wherein
the data line is coupled with a plurality of the memory cells.

17. The method of claim 14, wherein
the first type is a P-type;
the second type is an N-type; and
the predetermined logical value is a low logical value.

18. The method of claim 14, wherein
the first type is an N-type;
the second type is a P-type; and
the predetermined logical value is a high logical value.

19. The method of claim 14, wherein
the first voltage value is based on a threshold voltage of the first transistor.

20. The method of claim 14, wherein
the first voltage value causes the first transistor to turn off.

* * * * *